United States Patent
Hung et al.

(10) Patent No.: US 8,638,618 B2
(45) Date of Patent: Jan. 28, 2014

(54) DECODER FOR NAND MEMORY

(75) Inventors: Shuo-Nan Hung, Jhubei (TW); Chang Ting Chen, Hsinchu (TW); Chi-Yu Hung, Jhunan Township (TW); Tseng-Yi Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 169 days.

(21) Appl. No.: 13/185,887

(22) Filed: Jul. 19, 2011

(65) Prior Publication Data
US 2012/0163087 A1    Jun. 28, 2012

Related U.S. Application Data

(60) Provisional application No. 61/427,040, filed on Dec. 23, 2010.

(51) Int. Cl.
*G11C 7/00* (2006.01)

(52) U.S. Cl.
USPC .......... 365/189.11; 365/185.18; 365/185.17

(58) Field of Classification Search
USPC .......... 365/185.18, 189.11, 185.17, 185.23, 365/185.27, 185.33; 326/81
See application file for complete search history.

(56) References Cited

U.S. PATENT DOCUMENTS

| | | | |
|---|---|---|---|
| 8,248,852 B2 * | 8/2012 | Kim et al. | 365/185.11 |
| 2005/0024088 A1 * | 2/2005 | Lee | 326/81 |
| 2007/0230253 A1 | 10/2007 | Kim | |
| 2008/0062760 A1 | 3/2008 | Kim | |
| 2009/0310405 A1 | 12/2009 | Lee et al. | |

* cited by examiner

*Primary Examiner* — Son Dinh
*Assistant Examiner* — Nam Nguyen
(74) *Attorney, Agent, or Firm* — Kenta Suzue; Haynes Beffel & Wolfeld LLP (57) ABSTRACT

An integrated circuit device has multiple blocks of NAND memory cells, and a high voltage switch. The high voltage switch is coupled to a decoder output and the blocks of NAND memory cells. The high voltage switch has an output voltage range with positive and negative voltages.

20 Claims, 12 Drawing Sheets

| Operation | | SEL | SELB | VPWR | VNP | VPP | SELHB | SELH |
|---|---|---|---|---|---|---|---|---|
| Program | Select | VDD | 0 | VDD | 0 | 30 | 0 | 30 |
| | Deselect | 0 | VDD | VDD | 0 | 30 | VDD | 0 |
| Erase | Select | VDD | 0 | 2 | -15 | 10 | -15 | 10 |
| | Deselect | 0 | VDD | 2 | -15 | 10 | 2 | -15 |
| Read | Select | VDD | 0 | VDD | 0 | 8 | 0 | 8 |
| | Deselect | 0 | VDD | VDD | 0 | 8 | VDD | 0 |

DECODER FOR NAND MEMORY

REFERENCE TO RELATED APPLICATIONS

This application claims the benefit of U.S. Provisional Application No. 61/427,040, filed on 23 Dec. 2010, incorporated herein by reference.

BACKGROUND

1. Field of the Invention

This technology relates to a decoder for a NAND memory array.

2. Description of Related Art

A traditional NAND flash design has no negative voltage. All the biases are equal to or larger than 0 volt even when doing erase verify, if the erased cell Vt threshold voltage distribution is below 0 volts. Such designs implement a so-called reverse read operation.

Because of the absence of need for negative voltages for an x-decoder in NAND flash memory, NAND flash memory often uses the traditional x-decoder selector.

In US Patent Application Publication 2008/0062760, a negative level shifter provides negative voltages to select and deselect blocks in the NAND memory array, but has no assisting circuitry for positive level shifting. As a result, the PMOS transistors have more demanding operational requirements.

In US Patent Application Publication 2009/0310405, a positive level shifter is followed by a negative level shifter. However, this design still has demanding operational requirements for the PMOS transistors.

It would be desirable for a high voltage switch to have a wide positive and negative voltage range, without demanding operational requirements for the PMOS transistors.

SUMMARY

Various embodiments describe a high voltage switch capable of negative voltage input for a NAND memory array.

One aspect of the technology is an integrated circuit high voltage switch device with a level shifter and a pull-up circuit.

The level shifter receives a signal, and the level shifter has an output providing a level shifter voltage output with a first voltage range.

The pull-up circuit is coupled to the output of the level shifter. The pull-up circuit has an output providing a pull-up circuit voltage output with a second voltage range wider than the first voltage range.

In one embodiment, the signal is a decoder signal and the output of the pull-up circuit is provided to a word line of a memory array.

In one embodiment, the level shifter comprises at least one PMOS transistor and at least one NMOS transistor, and the signal is input to the at least one PMOS transistor.

In one embodiment, the pull-up circuit comprises a PMOS transistor and a NMOS transistor, and the PMOS transistor receives a trigger signal to output the pull-up circuit voltage output, the trigger signal received from at least one of a decoder and the output of the level shifter.

In one embodiment, the level shifter is a negative level shifter, and the first voltage range of the level shifter is set by a negative first bias voltage and a positive second bias voltage both coupled to the level shifter, and the second voltage range is set by a positive third bias voltage and the negative first bias voltage both coupled to the pull-up circuit. In one embodiment, during a select operation in erasing, the second voltage output is a voltage equal to the positive third bias voltage. In one embodiment, during a deselect operation in erasing, the second voltage output is a voltage equal to the negative first bias voltage.

In one embodiment, the first voltage range of the level shifter voltage output is wider than the signal, by including a negative voltage magnitude absent from the decoder signal.

In one embodiment, the second voltage range of the pull-up circuit voltage output is wider than the signal, by including a negative voltage magnitude absent from the signal and a positive voltage magnitude absent from the signal.

In one embodiment, the pull-up circuit voltage output selects or deselects a NAND memory block.

Another aspect is a method of decoding addresses for a memory operation with a word line coupled to a word line of an integrated circuit device, comprising:

receiving, at a level shifter, a decoder signal; and providing, from the level shifter, a level shifter output signal having a first voltage range, to a pull-up circuit;

providing, from the pull-up circuit, a voltage switch output signal with a second voltage range widened compared to the first voltage range.

In one embodiment, wherein the level shifter comprises at least one PMOS transistor and at least one NMOS transistor, and the decoder signal from the decoder is input to the at least one PMOS transistor.

In one embodiment, the pull-up circuit comprise a PMOS transistor and a NMOS transistor, and the PMOS transistor receives a trigger signal to output the pull-up circuit voltage output, the trigger signal received from at least one of the decoder and the output of the level shifter.

In one embodiment, the level shifter is a negative level shifter, and the first voltage range of the level shifter is set by a negative first bias voltage and a positive second bias voltage both coupled to the level shifter, and the second voltage range is set by a positive third bias voltage and the negative first bias voltage both coupled to the pull-up circuit.

One embodiment, further comprises a select operation in erasing during which the second voltage output is a voltage equal to the positive third bias voltage.

One embodiment, further comprises a deselect operation in erasing, during which the second voltage output is a voltage equal to the negative first bias voltage.

One embodiment, further comprises receiving, at the pull-up circuit, (i) the decoder signal and (ii) the level shifter output signal, the pull-up circuit providing to a block of NAND memory cells a pull-up circuit output signal.

In one embodiment, the decoder signal has a third voltage range, and wherein the second voltage range is wider compared to the third voltage range by including a larger magnitude negative voltage that is absent from the third voltage range, and wherein the second voltage range is wider compared to the third voltage range by including (i) a larger magnitude negative voltage that is absent from the third voltage range and (ii) a larger magnitude positive voltage that is absent from the third voltage range.

In one embodiment, the second voltage range is wider compared to the first voltage range by including a larger magnitude positive voltage that is absent from the first voltage range.

One aspect of the technology is an integrated circuit device which includes a high voltage switch. The high voltage switch accepts signals from a decoder, where the select/deselect or enable/disable signals have logic signal values to indicate whether a particular memory block is selected/deselected or enabled/disabled. The high voltage switch then shifts these logic signals to voltages that are sufficiently positive and negative to select and deselect memory blocks. The high voltage switch includes a level shifter and a pull-up circuit such as an x-decoder or row decoder circuit. The level shifter may also be a negative level shifter.

The high voltage switch is coupled to (i) a decoder and (ii) a word line coupled to a block of NAND memory cells. The decoder may also be a block decoder. The high voltage switch has a high voltage switch output signal with an output voltage range with positive and negative voltages.

The level shifter is coupled to the decoder. The level shifter receives a decoder signal, in various embodiments indicating whether the word line is selected or deselected. The decoder signal has a first voltage range. The level shifter provides a level shifter output signal having a second voltage range to a pull-up circuit. The second voltage range is wider compared to the first voltage range by including a larger magnitude negative voltage that is absent from the first voltage range.

The pull-up circuit is coupled to the level shifter and coupled to the word line. The pull-up circuit receives (i) the decoder signal and (ii) the level shifter output signal. The pull-up circuit provides to the block of NAND memory cells a pull-up circuit output signal that in various embodiments couples or decouples the particular word line from a word line power signal. The pull-up circuit provides the high voltage switch output signal with the output voltage range widened compared to the first voltage range by including (i) a larger magnitude negative voltage that is absent from the first voltage range and (ii) a larger magnitude positive voltage that is absent from the first voltage range.

More generally, a pull-up circuit such as an x-decoder or row decoder circuit receives an enable/disable signal from the decoder and a complement of the enable/disable signal, or processed versions thereof. Alternatively, rather than receiving the complement of the enable/disable signal from the decoder, the pull-up circuit receives the negative voltage reference from the level shifter. In response to the enable signal, the pull-up circuit outputs a larger voltage than the enable signal (such as VPP) to widen the positive voltage range of the high voltage switch output sent to the NAND memory array. In response to the disable signal, the pull-up circuit outputs the disable signal, such as with a negative voltage signal with an enlarged magnitude from the level shifter.

In one embodiment, the output voltage range of the high voltage switch output signal is wider compared to the second voltage range of the level shifter output signal by including a larger magnitude positive voltage that is absent from the second voltage range. This is advantageous because transistors associated with a narrower range have less demanding operational requirements and can be smaller. In another embodiment, the second voltage range of the level shifter output signal and the second voltage range of the level shifter output signal have equal maximum voltage values.

In one embodiment, the output voltage range of the high voltage switch output signal corresponds to largest and smallest values out of the selected and deselected states of the decoder signal across program, erase, and read operations.

In one embodiment, the second voltage range of the level shifter output signal corresponds to largest and smallest values out of the selected and deselected states of the decoder signal across program, erase, and read operations.

In one embodiment, the pull-up circuit includes an n-type transistor having a gate that receives a maximum voltage of the output voltage range of the high voltage switch during operation of the high voltage switch. In another embodiment, the high voltage switch includes an n-type transistor having a gate that receives a maximum voltage of the output voltage range of the high voltage switch during operation of the high voltage switch. The high voltage switch includes a plurality of p-type transistors. All of the plurality of p-type transistors have a gate that fails to receive the maximum voltage of the output voltage range of the high voltage switch during operation of the high voltage switch.

In one embodiment, the high voltage switch includes an n-type transistor having a gate that receives a maximum voltage of the output voltage range of the high voltage switch during operation of the high voltage switch, and the high voltage switch includes a plurality of p-type transistors, all of the plurality of p-type transistors having a gate that fails to receive the maximum voltage of the output voltage range of the high voltage switch during operation of the high voltage switch.

One aspect of the technology is a method of decoding addresses for a memory operation with a word line coupled to a block of NAND memory cells of an integrated circuit device. The method steps comprise:
  receiving, at a level shifter, a decoder signal in various embodiments indicating whether the word line is selected or deselected, the decoder signal having a first voltage range;
  providing, from the level shifter, a level shifter output signal having a second voltage range, to a pull-up circuit, the second voltage range wider compared to the first voltage range by including a larger magnitude negative voltage that is absent from the first voltage range;
  receiving, at the pull-up circuit, (i) the decoder signal and (ii) the level shifter output signal, the pull-up circuit providing to the block of NAND memory cells a pull-up circuit output signal that in various embodiments couples or decouples the particular word line from a word line power signal; and
  providing, from the pull-up circuit, the high voltage switch output signal with the output voltage range widened compared to the first voltage range by including (i) a larger magnitude negative voltage that is absent from the first voltage range and (ii) a larger magnitude positive voltage that is absent from the first voltage range.

In one embodiment, the output voltage range of the high voltage switch output signal is wider compared to the second voltage range of the level shifter output signal by including a larger magnitude positive voltage that is absent from the second voltage range. This is advantageous because transistors associated with a narrower range have less demanding operational requirements and can be smaller. In one embodiment, the second voltage range of the level shifter output signal and the second voltage range of the level shifter output signal have equal maximum voltage values.

In one embodiment, the output voltage range of the high voltage switch output signal corresponds to largest and smallest values out of the selected and deselected states of the decoder signal across program, erase, and read operations.

In one embodiment, the second voltage range of the level shifter output signal corresponds to largest and smallest values out of the selected and deselected states of the decoder signal across program, erase, and read operations.

One embodiment further comprises:
  receiving, at a gate of an n-type transistor in the pull-up circuit (in another embodiment, the high voltage switch), a maximum voltage of the output voltage range of the high voltage switch during operation of the high voltage switch, and failing to receive, at gates of all p-type transistors in the high voltage switch, the maximum voltage of the output voltage range of the high voltage switch during operation of the high voltage switch.

One aspect of the technology is an integrated circuit device which includes a plurality of blocks of NAND memory cells and a high voltage switch. The high voltage switch includes a level shifter and a pull-up circuit. The high voltage switch is coupled to a decoder and the plurality of blocks of NAND memory cells. The high voltage switch has an output voltage range with positive and negative voltages.

The level shifter is coupled to the decoder.

The pull-up circuit is coupled to the level shifter and coupled to the plurality of blocks of memory cells. The high voltage switch has NMOS transistors and PMOS transistors, with reduced operating requirements for the PMOS transistors compared to the NMOS transistors.

In one embodiment, the output voltage range of the high voltage switch is wider compared to an output voltage range of the level shifter by including a larger magnitude positive voltage that is absent from the voltage range of the level shifter. This is advantageous because transistors associated with a narrower range have less demanding operational requirements and can be smaller. In one embodiment, the output voltage range of the high voltage switch and an output voltage range of the level shifter have equal maximum voltage values.

In one embodiment, the output voltage range of the high voltage switch corresponds to largest and smallest values out of selected and deselected states indicated by the decoder across program, erase, and read operations.

In one embodiment, an output voltage range of the level shifter corresponds to largest and smallest values out of selected and deselected states indicated by the decoder across program, erase, and read operations.

In one embodiment, the reduced operating requirements comprises: the pull-up circuit including an n-type transistor having a gate that receives a maximum voltage of the output voltage range of the high voltage switch during operation of the high voltage switch, and the high voltage switch includes a plurality of p-type transistors, all of the plurality of p-type transistors having a gate that fails to receive the maximum voltage of the output voltage range of the high voltage switch during operation of the high voltage switch.

In one embodiment, the reduced operating requirements comprises: the high voltage switch includes an n-type transistor having a gate that receives a maximum voltage of the output voltage range of the high voltage switch during operation of the high voltage switch, and the high voltage switch includes a plurality of p-type transistors, all of the plurality of p-type transistors having a gate that fails to receive the maximum voltage of the output voltage range of the high voltage switch during operation of the high voltage switch.

One aspect of the technology is an integrated circuit device, comprising a plurality of blocks of NAND memory cells, and a high voltage switch. The high voltage switch is coupled to a decoder and the plurality of blocks of NAND memory cells. The high voltage switch has an output voltage range with positive and negative voltages.

In some embodiments, the high voltage switch comprises a level shifter coupled to the decoder; and a pull-up circuit. The pull-up circuit is coupled to the level shifter and coupled to the plurality of blocks of memory cells.

In some embodiments, the high voltage switch comprises a level shifter coupled to the decoder; and a pull-up circuit. The pull-up circuit is coupled to the level shifter and coupled to the plurality of blocks of memory cells. The level shifter and the pull-up circuit are sufficient to generate the output voltage range of the high voltage switch. For example, two stages of level shifter circuits are not required.

In some embodiments, the high voltage switch comprises a level shifter coupled to the decoder; and a pull-up circuit. The pull-up circuit is coupled to the level shifter and coupled to the plurality of blocks of memory cells. The high voltage switch has NMOS transistors and PMOS transistors, with reduced operating requirements for the PMOS transistors compared to the NMOS transistors.

DETAILED DESCRIPTION

A negative voltage selector is useful for many cases, such as a forward read for erase verify on an erased cell with a negative threshold voltage Vt, or in case a negative voltage is required for the memory cell when performing some operation other than erase verify.

Figure 1:
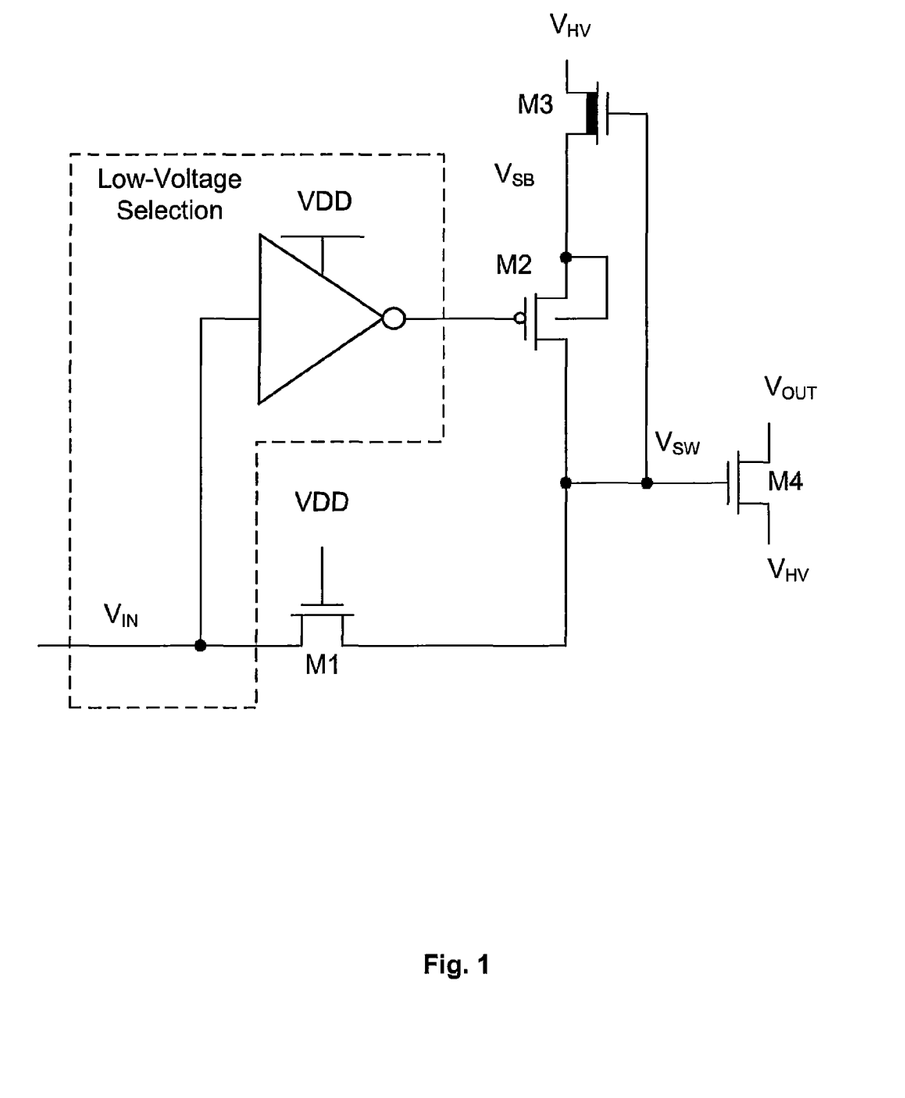
FIG. 1 shows a high voltage switch used in NAND Flash memory.

FIG. 1 shows a high voltage switch used in NAND Flash memory.

M3 is a depletion NMOS transistor. The threshold voltages of M2 and M3, in one example, are −1 V and −0.8 V respectively. In one case Vin is low and Vsw=GND ground. M2 is off and Vsb is equal to 0.8 V (M3 has a negative Vth threshold voltage). M4 is off and Vout is independent of Vhv. When Vin approaches Vdd, M2 turns on, raising the voltage of node Vsw. Transistor M1 contributes to the rise of Vsw until Vsw equals VDD-Vth,M1. At this point, M1 is diode-connected and isolates the low-voltage section of the circuit, indicated as the inverter. The positive feedback between nodes Vsb and Vsw (through M2 and M3) takes voltage Vsw to the value Vhv.

Figure 2:
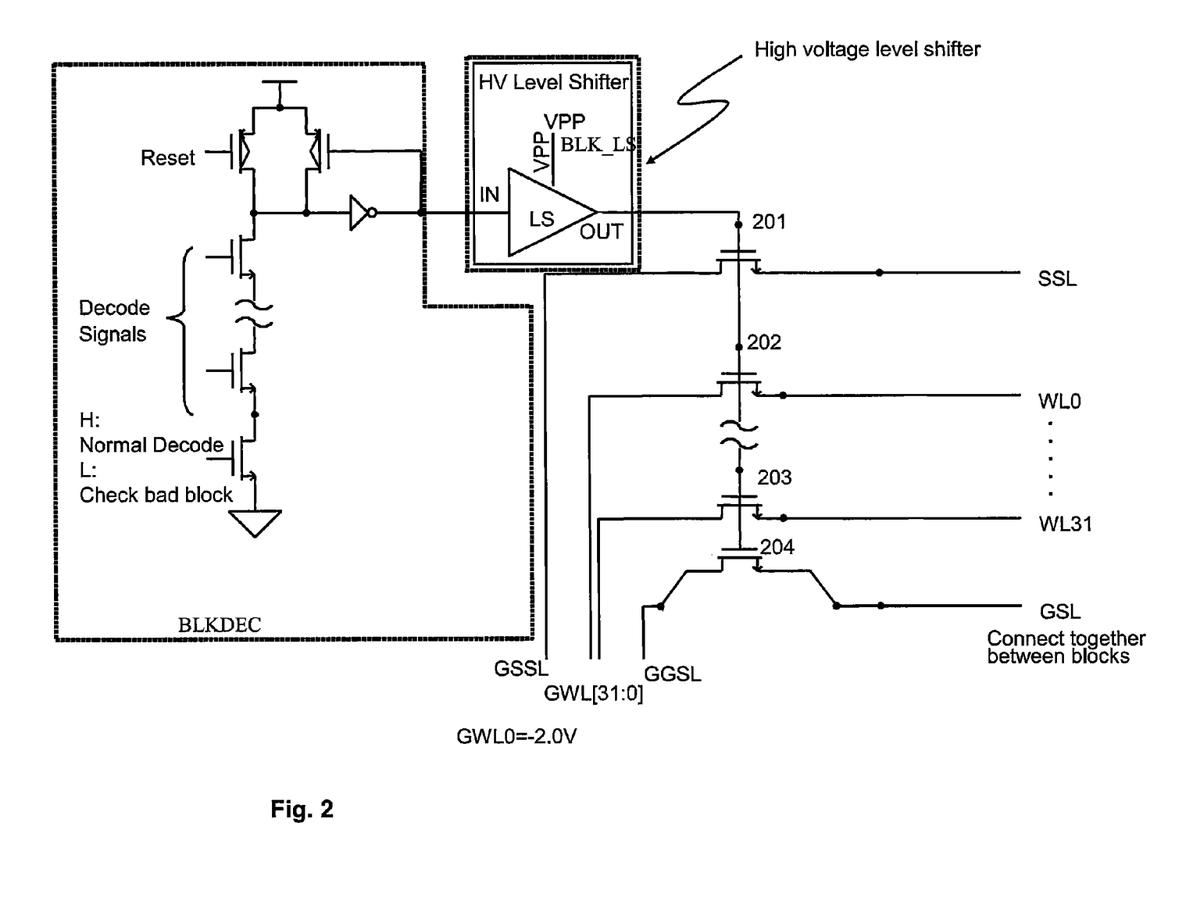
FIG. 2 shows an x-decoder of a NAND flash memory, with the switch of FIG. 1 as the high voltage shifter.

FIG. 2 shows an x-decoder of a NAND flash memory, with the switch of FIG. 1 as the high voltage shifter.

A memory integrated circuit contains many blocks of memory cells. Every block of the array is accompanied by the x-decoder unit. In turn, each block contains many strings or lines of NAND memory accessed by multiple bit lines and word lines. Global word lines GWL[31:0], global string select line GSSL, and global ground select line GGSL are global signals that provide power for word lines WL[31:0], string select line SSL, and ground select line GSL, of every block. Whether a particular block is selected, is decoded by the decoder BLKDEC circuit.

If the block is selected, then the high voltage switch, or high voltage level shifter, outputs VPP, and hence turns on the transistors 201, 202, 203 and 204 that are series connected with the NAND strings. In that case, the word line WL0 of the selected block will connect to GWL0, the word line WL1 of the selected block will connect to GWL1, and so on for the remainder of global word lines GWL[31:0] and word lines WL[31:0]. In addition to the word lines WLs, the string select line SSL and ground select GSL of each block work similarly.

If the block is deselected, the high voltage switch outputs GND to disconnect the word lines WLs, string select line SSL, and ground select line GSL of the deselected block.

Figure 3:
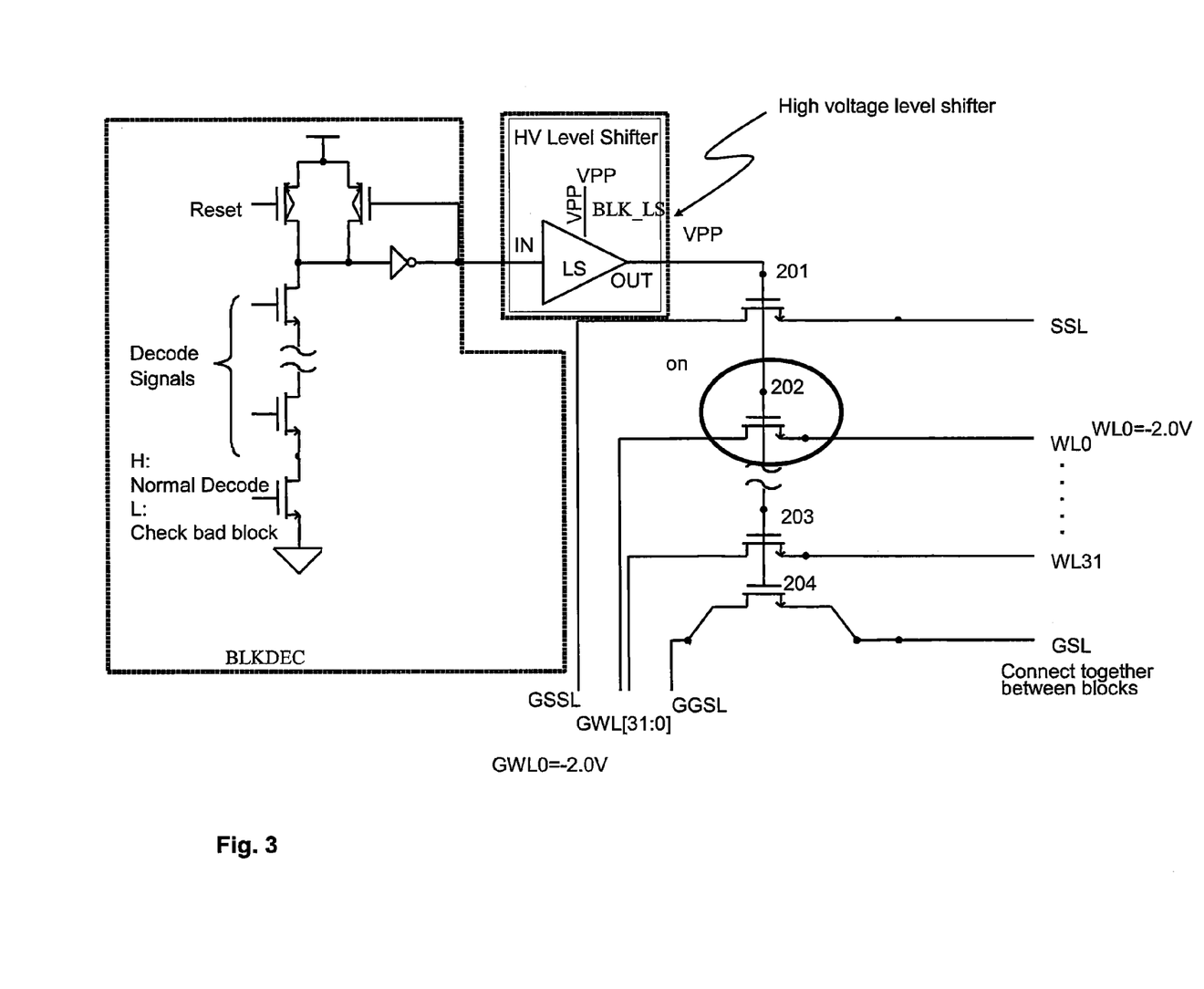
FIG. 3 shows an x-decoder of a NAND flash memory with limited block control, and in particular shows a selected block, with the switch of FIG. 1 as the high voltage shifter.

FIG. 3 shows an x-decoder of a NAND flash memory with limited block control, and in particular shows a selected block, with the switch of FIG. 1 as the high voltage level shifter.

In some cases, the NAND memory cell itself needs a negative voltage during operation. In one example, a word line WL is required to be biased at −2.0V for an operation, which is not possible with some traditional kinds of high voltage switch.

For example, global word line GWL0=−2V, and transistor 202 of the selected block is on, as shown in FIG. 3.

Figure 4:
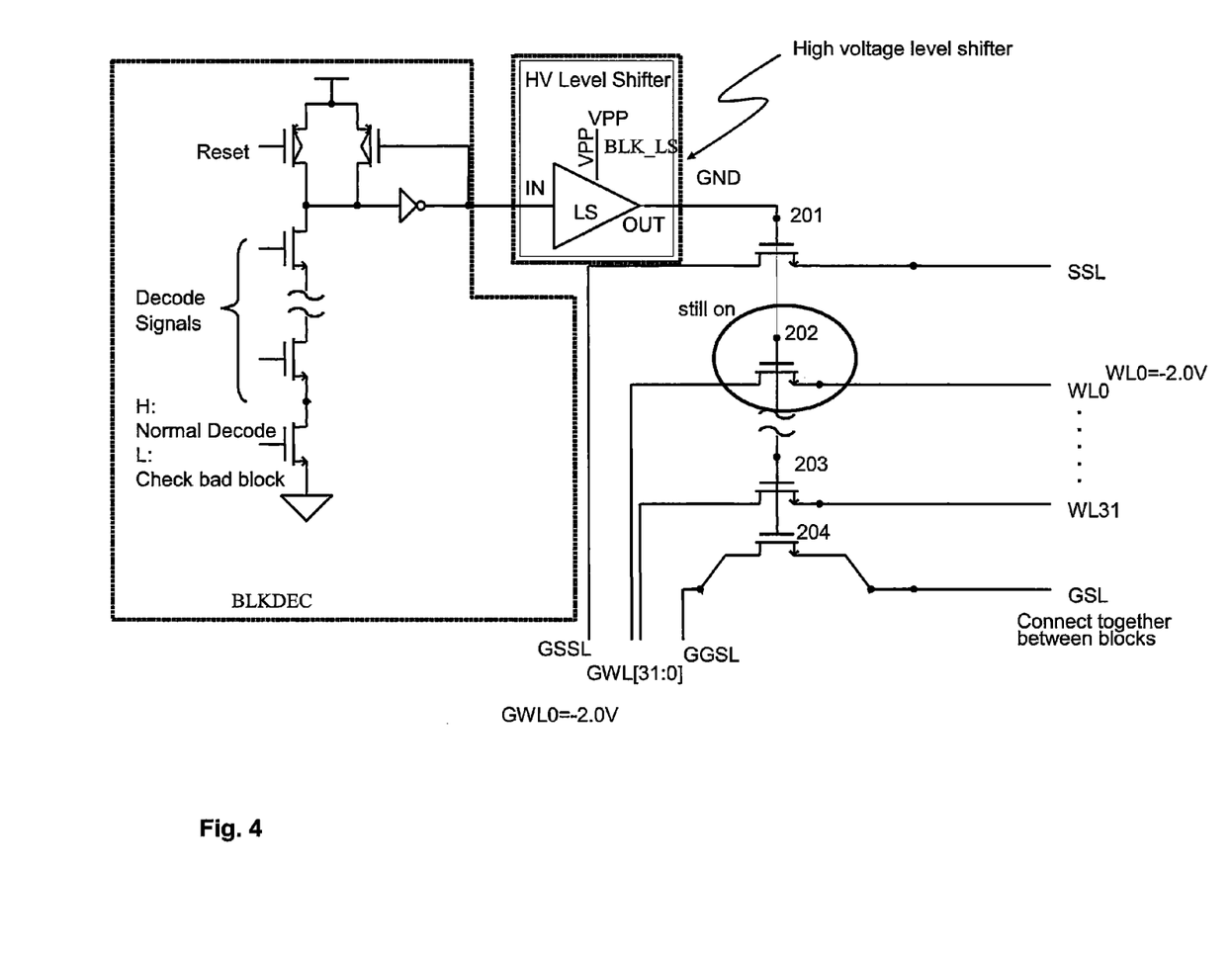
FIG. 4 shows an x-decoder of a NAND flash memory with limited block control, and in particular shows a deselected block, with the switch of FIG. 1 as the high voltage shifter.

FIG. 4 shows an x-decoder of a NAND flash memory with limited block control, and in particular shows a deselected block, with the switch of FIG. 1 as the high voltage shifter.

Those transistor 202s of the other deselected blocks are still on because the lowest output voltage of the high voltage shifter is GND.

Figure 5:
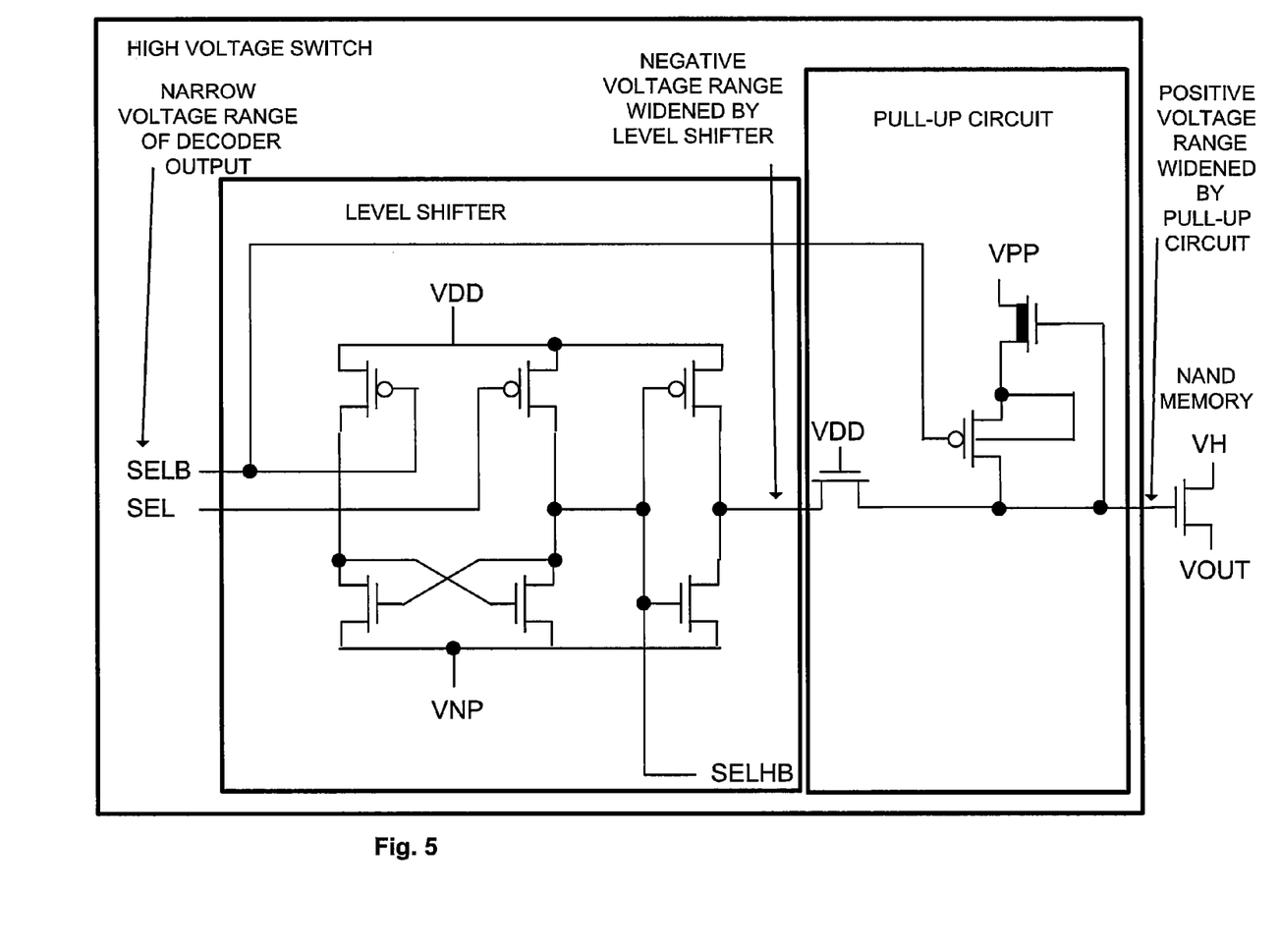
FIG. 5 shows an improved high voltage switch.

FIG. 5 shows an improved high voltage switch, or high voltage switch.

The improved high voltage switch, or high voltage switch, is capable of providing to the NAND memory, a negative voltage input to turn off a NAND memory block. With this circuit, the previously described problem will not happen, of mistakenly enabled memory blocks in the NAND array. Accordingly, the improved high voltage switch, or high voltage switch, can provide a negative voltage to turn off deselected memory blocks.

VNP is the most negative voltage of the chip during operation. VPP is the most positive voltage of the chip during operation.

The high voltage switch includes a level shifter and a pull-up circuit. The input of the high voltage switch is a SEL signal from the decoder enabling/disabling a memory block of the NAND array.

The level shifter resembles cross-coupled inverters, in that there are two pairs of p-type and n-type transistors that are series connected between a high VDD voltage reference and a low VNP voltage reference, and the gate of each n-type transistor is cross-coupled to the drain of the other n-type transistor. However, unlike an inverter, the gates of the p-type transistors are respectively coupled to the SEL signal from the decoder enabling/disabling a memory block, and the complement signal SELB. The output is an internal node of one of the series connected pair of p-type and n-type transistors. In the shown embodiment, the output is the internal node of one of the series connected pair of p-type and n-type transistors, including the p-type transistor with a gate receiving the SEL signal from the decoder enabling/disabling a memory block. This output is further processed by an inverter. The output of the level shifter has a negative voltage range widened by the level shifter, to include VNP.

The pull-up circuit has an optional n-type transistor connecting the level shifter output with the primary part of the pull-up circuit, which is identical to an x-decoder or row decoder circuit. An n-type depletion mode transistor is series connected with a p-type transistor between VPP and the high voltage switch output. The n-type depletion mode transistor has a gate connected to the high voltage switch output, a drain connected to VPP, and a source connected to the source of the p-type transistor. The p-type transistor has a drain connected to the high voltage switch output, and a gate connected to the decoder signal SELB.

More generally, a pull-up circuit such as an x-decoder or row decoder circuit receives an enable/disable signal and a complement of the enable/disable signal. In response to the enable signal, the pull-up circuit outputs a larger voltage than the enable signal (such as VPP). In response to the disable signal, the pull-up circuit outputs the disable signal.

In the high voltage switches described by FIGS. 5 and 7-10, a level shifter stage is followed by a decoder stage. The negative voltage shifter stage outputs the signals with an expanded negative voltage range, and the decoder stage outputs the signals with expanded positive voltage range.

The level shifter stage receives as input the block select SEL signal. In many embodiments the block select SEL signal has, as is common with logical circuit outputs, a single polarity (negative or positive), commonly positive. The block select SEL signal therefore commonly has values of the decoder output, such as logical values of VDD or ground. After the level shifter stage receives the block select SEL signal, the level shifter stage outputs a signal between the wider range of VDD and VNP. The level shifter stage widens the lower voltage range from GND to a negative VNP.

The decoder stage widens the signal range from VDD and VNP, to VPP and VNP. Whereas the maximum voltage of the level shifter stage was VDD, corresponding to the logical circuit output maximum, the maximum voltage of the decoder stage is VPP, which is higher than VDD.

Figure 6:
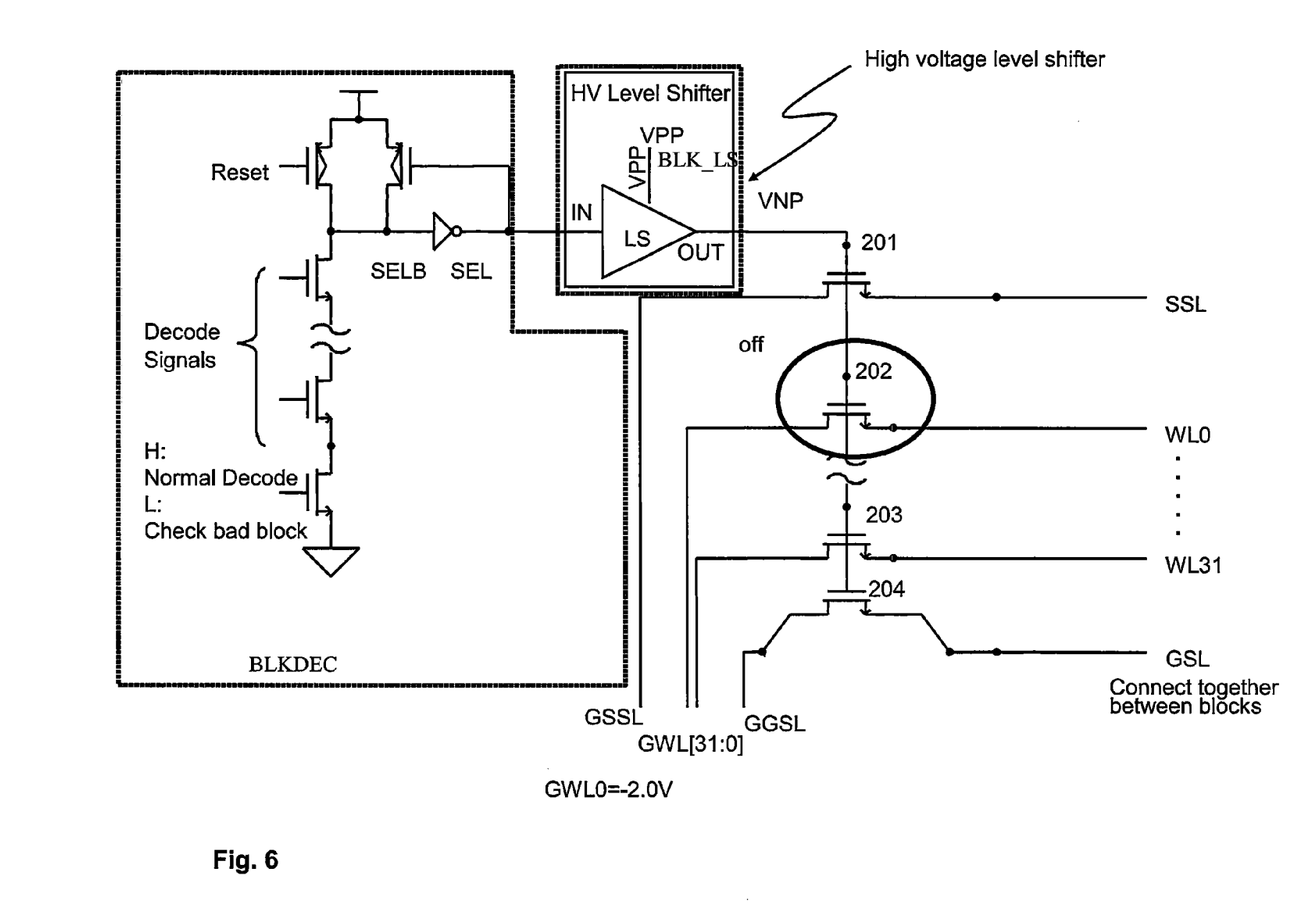
FIG. 6 shows an x-decoder of a NAND flash memory with improved block control, and in particular shows a deselected block, with the switch of FIG. 6 as the high voltage shifter.

FIG. 6 shows an x-decoder of a NAND flash memory with improved block control, and in particular shows a deselected block, with the switch of FIG. 6 as the high voltage shifter.

Unlike the earlier FIGS. 2-4, because the lowest output voltage of the high voltage shifter is sufficiently negative, those transistor 202s of the deselected blocks are off.

Figure 7:
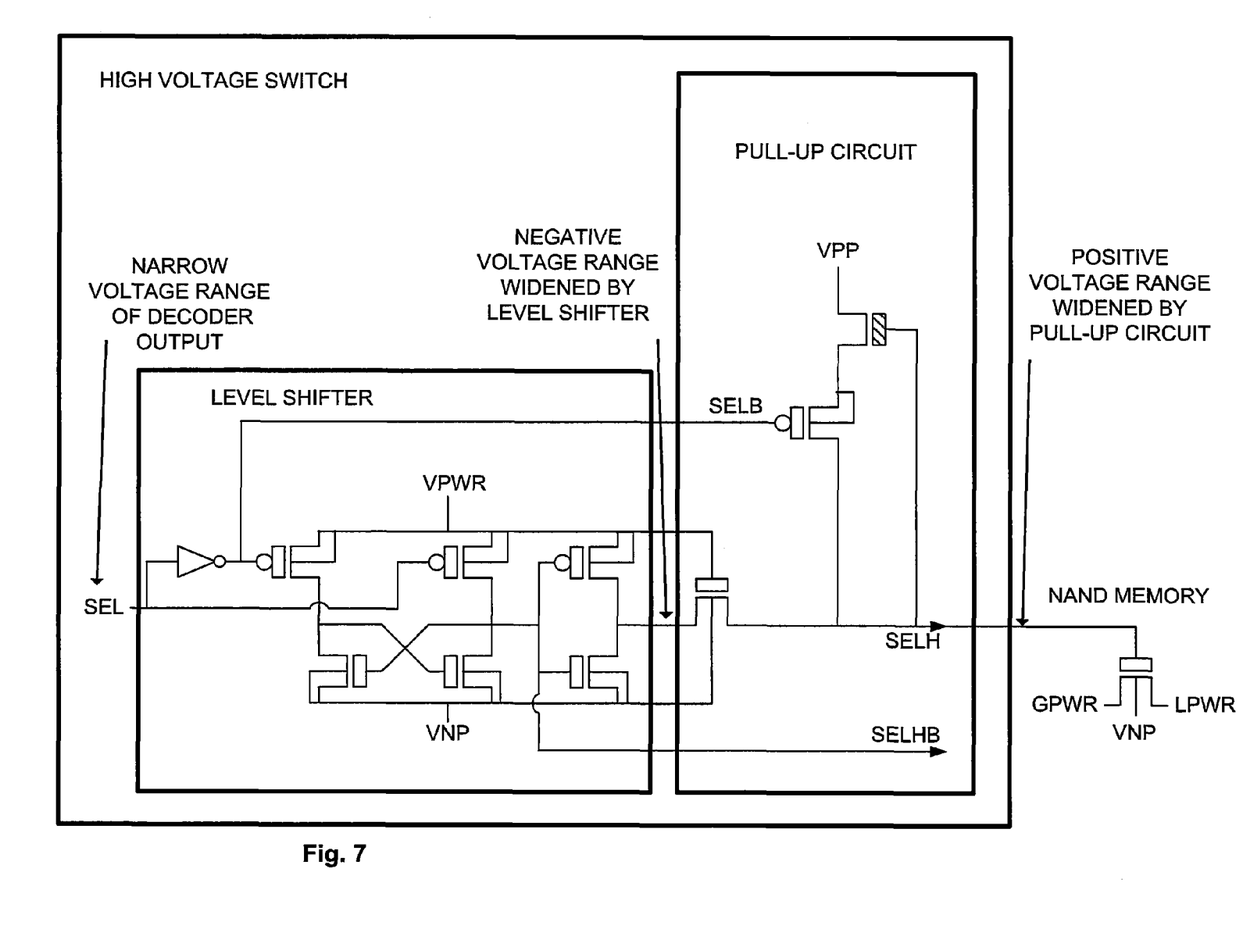
FIGS. 7-10 show various improved high voltage switches.

FIG. 7 shows another improved high voltage switch, or high voltage switch.

The high voltage switch includes a level shifter followed by a pull-up circuit. The high voltage switch is followed by a transistor which is series-connected with NAND strings. The NAND memory block is enabled or disabled as described above in connection with the above figures, depending on whether the voltage switch received a high or low block select signal.

In comparison with FIG. 5, the high voltage switch of FIG. 7 shows an inverter that receives the decoder signal SEL and generates the complement of the decoder signal SELB. The complement of the decoder signal can be generated by the decoder, or subsequently, as in FIG. 7.

Figure 8:
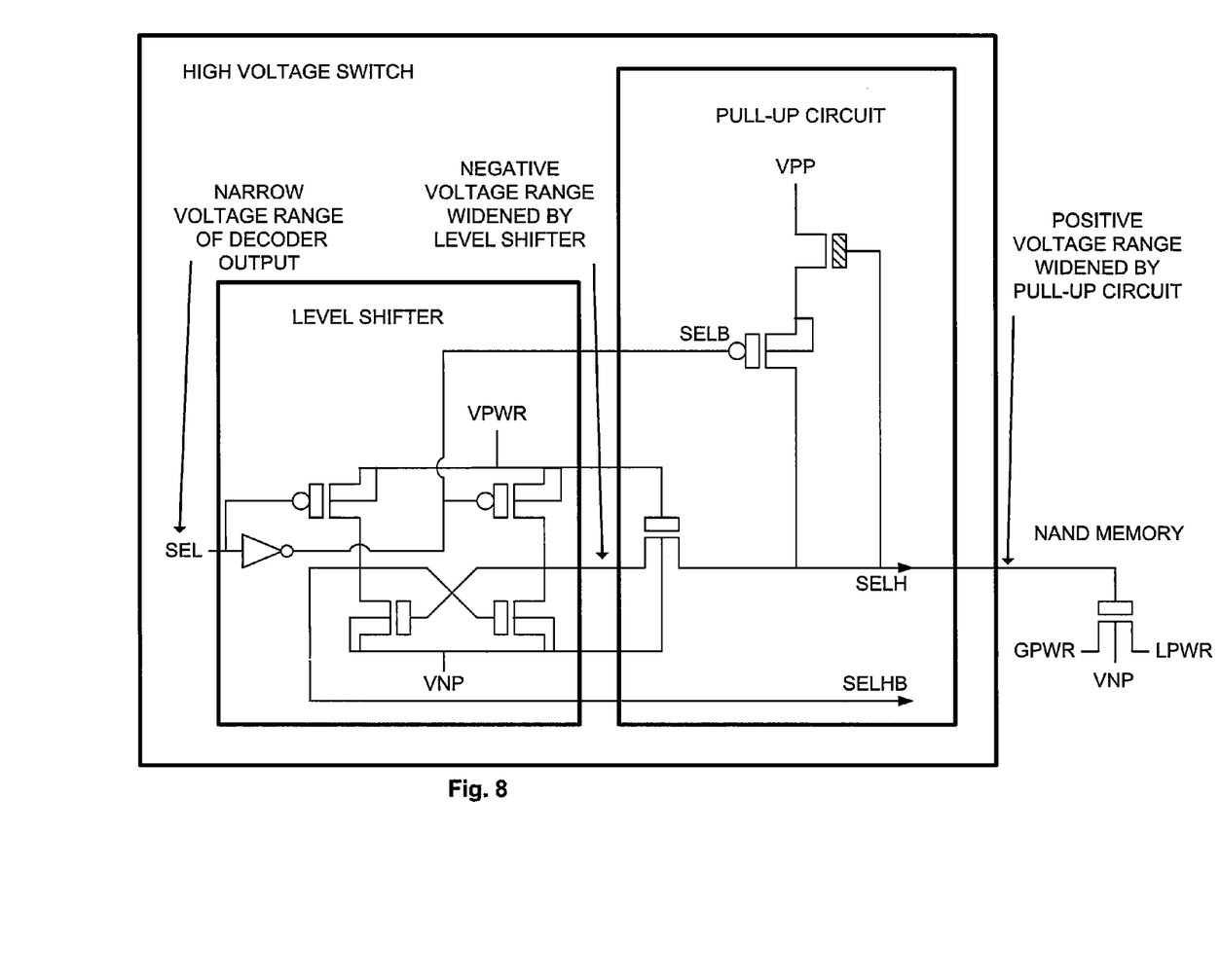

FIG. 8 shows another improved high voltage switch, or high voltage switch.

The high voltage switch includes a level shifter followed by a pull-up circuit. The high voltage switch is followed by a transistor which is series-connected with NAND strings. The NAND memory block is enabled or disabled as described above in connection with the above figures, depending on whether the voltage switch received a high or low block select signal. In contrast with FIG. 7, the input of the high voltage switch has reversed polarities of the block select SEL and block select bar SELB signals at the beginning Because of the reversed polarities, an inverter is removed from the level shifter of the high voltage switch.

Figure 9:
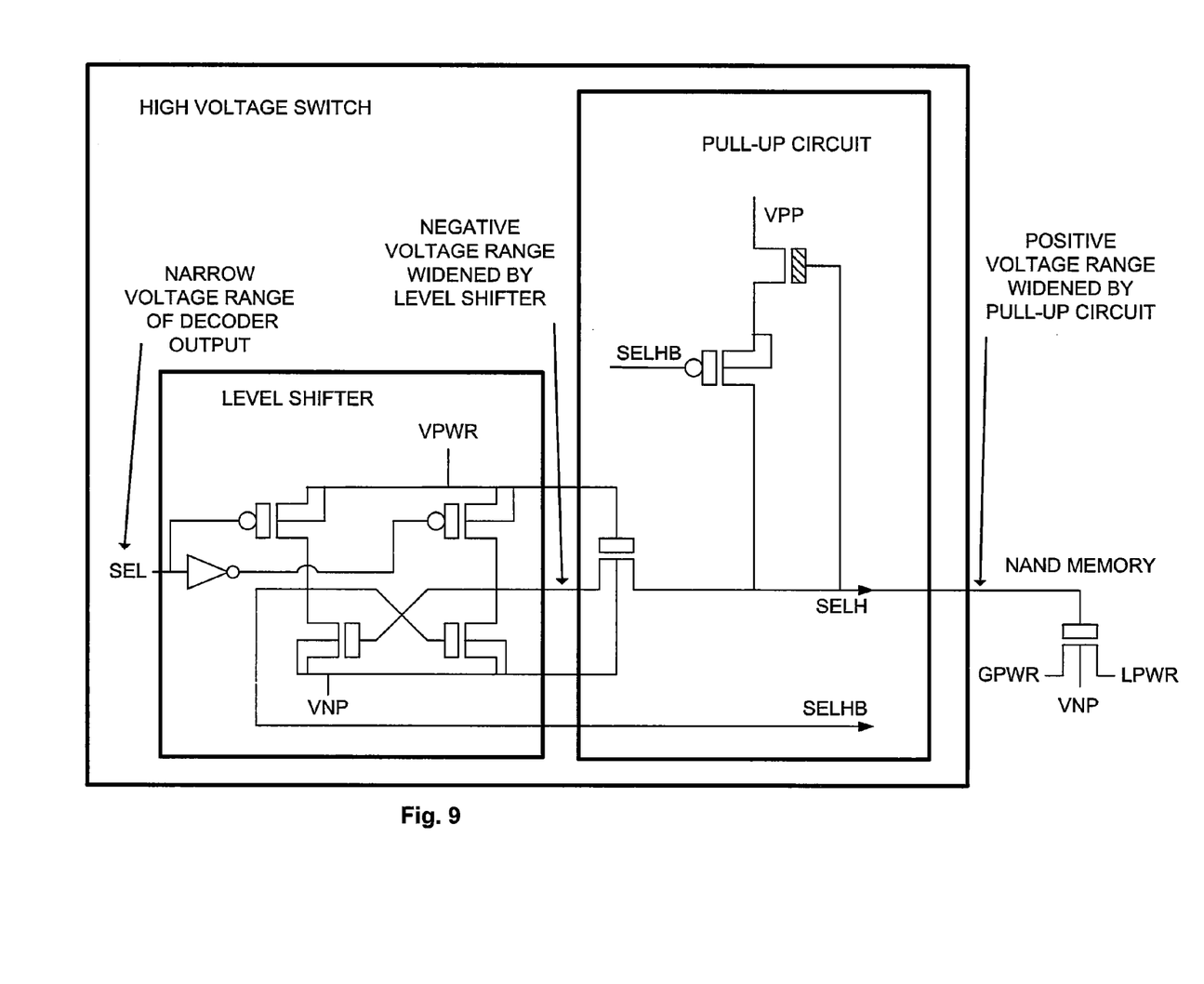

FIG. 9 shows another improved high voltage switch, or high voltage switch.

The high voltage switch includes a level shifter followed by a pull-up circuit. The high voltage switch is followed by a transistor which is series-connected with NAND strings. The NAND memory block is enabled or disabled as described above in connection with the above figures, depending on whether the voltage switch received a high or low block select signal.

In contrast with FIGS. 7 and 8, in FIG. 9 the gate of the p-type transistor in the pull-up circuit of the high voltage switch is coupled to neither the decoder output block select SEL signal nor its complement the block select bar SELB signal. Instead, the gate of the p-type transistor in the pull-up circuit of the high voltage switch is coupled to the SELHB signal, which in turn is coupled through an n-type transistor to VNP, the negative voltage reference of the level shifter. The SELH signal output and the SELHB signal are on different nodes within the level shifter.

Figure 10:
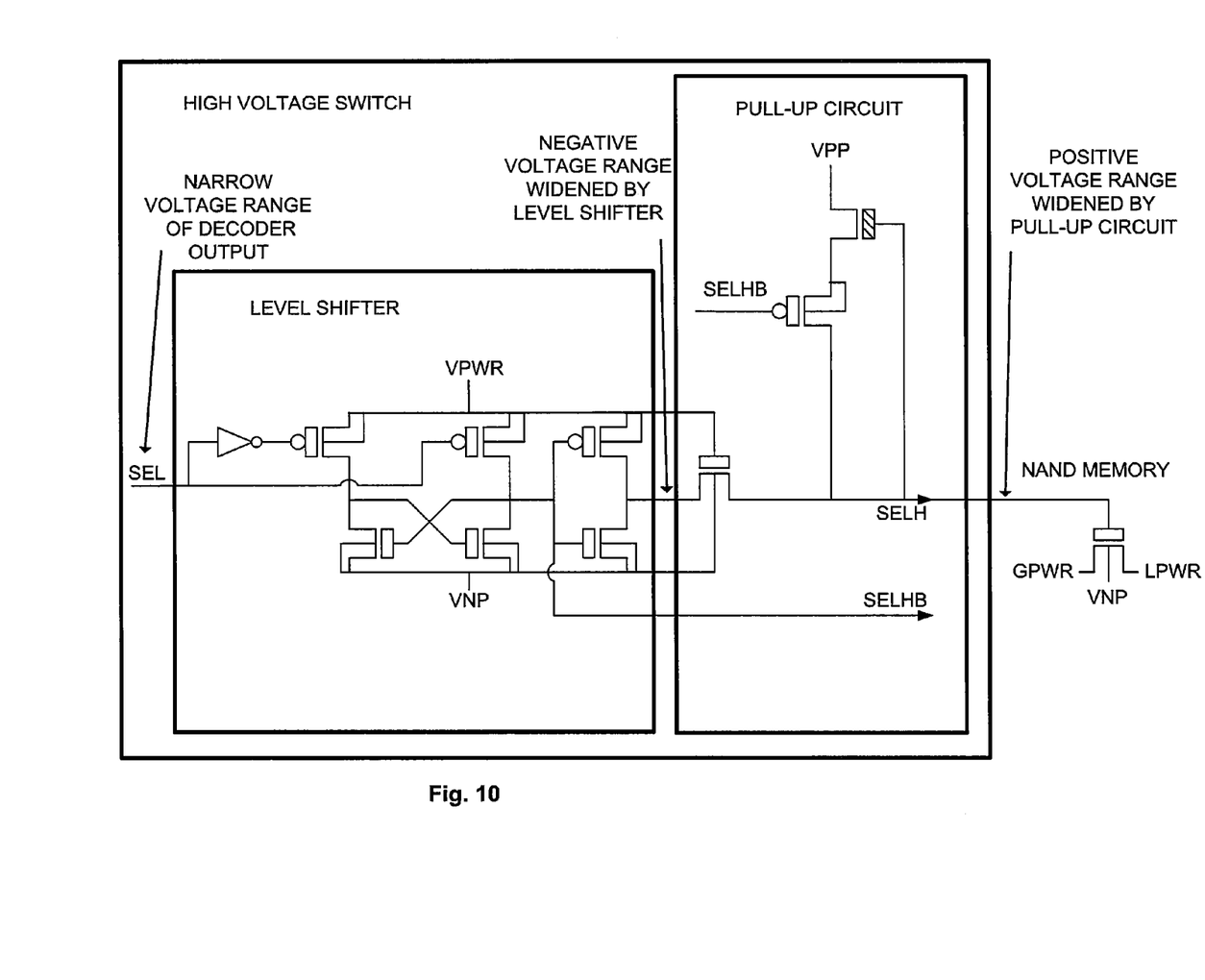

FIG. 10 shows another improved high voltage switch, or high voltage switch.

The high voltage switch includes a level shifter followed by a pull-up circuit. The high voltage switch is followed by a transistor which is series-connected with NAND strings. The NAND memory block is enabled or disabled as described above in connection with the above figures, depending on whether the voltage switch received a high or low block select signal.

In contrast with FIG. 9, the input of the high voltage switch has reversed polarities of the block select SEL and block select bar SELB signals at the beginning Because of the reversed polarities, an inverter is added to the level shifter of the high voltage switch.

Figure 11:
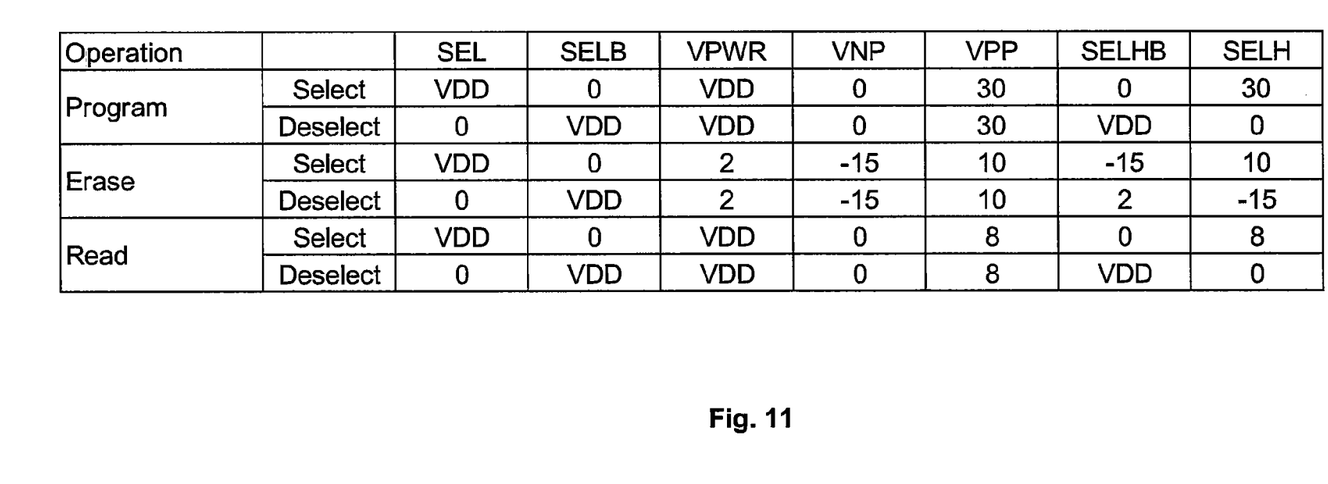
FIG. 11 shows a table of node voltages for the improved high voltage switch of FIG. 7.

FIG. 11 shows a table of node voltages for the circuit of FIG. 7, varying with different operations (read, erase, program) and with different block select status (select, deselect).

The table in FIG. 11 shows that the input of the high voltage switch, the signal SEL, and its complement SELB, have logical signal values of 0 and VDD. The purpose of the high voltage switch is to widen the voltage range of these signals sufficiently to select and deselect blocks of the memory array. The level shifter of the high voltage switch widens the voltage range to include VNP, the negative voltage reference of the level shifter. The pull-up circuit widens the voltage range to include VPP, the positive voltage reference of the pull-up circuit. Accordingly, the high voltage switch widens the voltage range of the signals from a relatively narrow range of 0 to VDD, to a relatively wide range of VNP and VPP.

In embodiments where VPP is higher than VDD, the transistor area is smaller.

The table shows that the operation requirement of NMOS transistors is higher than the operation requirement of PMOS transistors. In the shown table, the NMOS operation requirement is 30V (for example, VPP-SELH or VPP-SELHB). In the shown table, the PMOS operation requirement is 17V (for example, SELHB-SELH).

This reduced PMOS operation requirement results from the additional decoder stage between the negative level shifter stage and the NAND array. Such a reduced PMOS operation requirement reduces the area requirement of the PMOS transistors.

The NMOS/PMOS transistors sustain high voltage operation between VPWR & VNP. The total working range is limited by the NMOS. In some embodiments, this switch has outputs ranges of: −20~10V (Erase) and 0~30 V (Program).

Some embodiments generate, at the same time, a high magnitude positive voltage without a high magnitude negative voltage, and/or a high magnitude negative voltage without a high magnitude positive voltage. This feature reduces the area requirement of the transistors.

Figure 12:
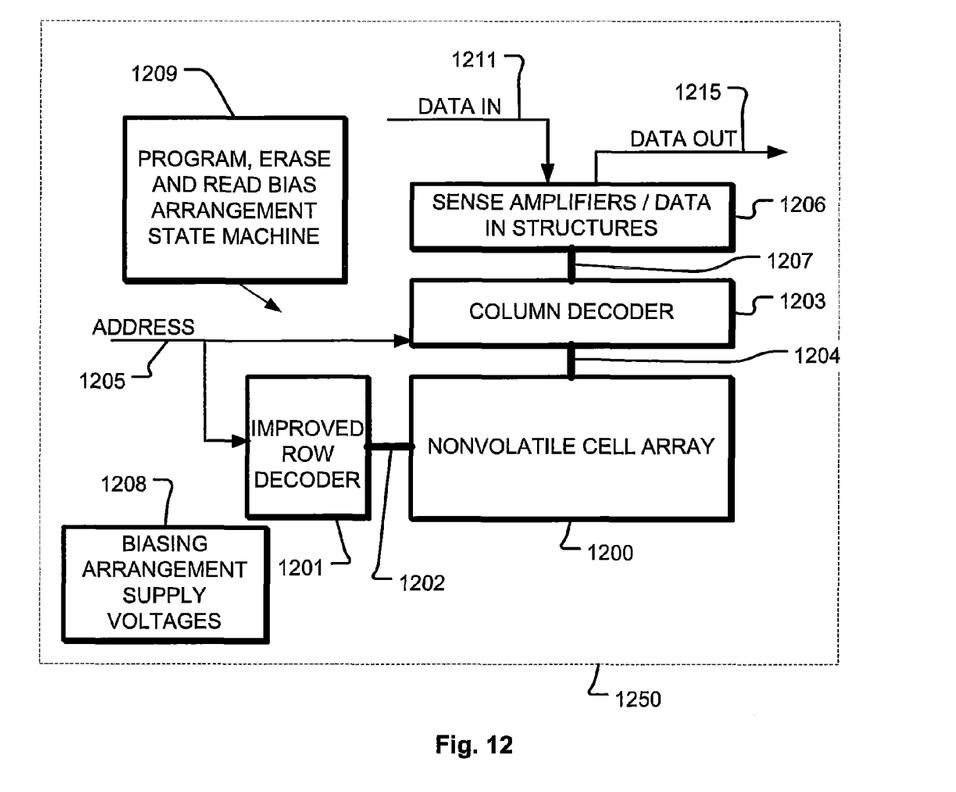
FIG. 12 is a block diagram of the integrated circuit including an array of nonvolatile programmable resistive memory cells, and other circuitry.

FIG. 12 is a block diagram of the integrated circuit including an array of nonvolatile programmable resistive memory cells, and other circuitry.

The integrated circuit 1250 includes a memory array 1200 implemented using NAND memory cells. Addresses are supplied on bus 1205 to column decoder 1203 and row decoder 1201 which includes the improved block selection/deselection circuitry. Sense amplifiers and data-in structures in block 1206 are coupled to the column decoder 1203 via data bus 1207. Data is supplied via the data-in line 1211 from input/output ports on the integrated circuit 1250, or from other data sources internal or external to the integrated circuit 1250, to the data-in structures in block 1206. Data is supplied via the data-out line 1215 from the block 1206 to input/output ports on the integrated circuit 1250, or to other data destinations internal or external to the integrated circuit 1250. The integrated circuit 1250 may also include circuitry directed a mission function other than the nonvolatile storage.

A controller implemented in this example using bias arrangement state machine 1209 controls the application of bias arrangement supply voltages 1208, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit high voltage switch device, comprising:
  a level shifter receiving a signal, the level shifter having an output providing a level shifter voltage output with a first voltage range; and
  a pull-up circuit coupled to the output of the level shifter, the pull-up circuit having an output providing a pull-up circuit voltage output with a second voltage range wider than the first voltage range.

2. The device of claim 1, wherein the signal is a decoder signal and the output of the pull-up circuit is provided to a word line of a memory array.

3. The device of claim 1, wherein the level shifter comprises at least one PMOS transistor and at least one NMOS transistor, and the signal is input to the at least one PMOS transistor.

4. The device of claim 1, wherein the pull-up circuit comprises a PMOS transistor and a NMOS transistor, and the PMOS transistor receives a trigger signal to output the pull-up circuit voltage output, the trigger signal received from at least one of a decoder and the output of the level shifter.

5. The device of claim 1, wherein:
  the level shifter is a negative level shifter, and
  the first voltage range of the level shifter is set by a negative first bias voltage and a positive second bias voltage both coupled to the level shifter, and the second voltage range is set by a positive third bias voltage and the negative first bias voltage both coupled to the pull-up circuit.

6. The device of claim 5, wherein during a select operation in erasing, the second voltage output is a voltage equal to the positive third bias voltage.

7. The device of claim 5, during a deselect operation in erasing, the second voltage output is a voltage equal to the negative first bias voltage.

8. The device of claim 1, wherein:
the first voltage range of the level shifter voltage output is wider than the signal, by including a negative voltage magnitude absent from the decoder signal.

9. The device of claim 1, wherein:
the second voltage range of the pull-up circuit voltage output is wider than the signal, by including a negative voltage magnitude absent from the signal and a positive voltage magnitude absent from the signal.

10. The device of claim 1, wherein:
the pull-up circuit voltage output selects or deselects a NAND memory block.

11. A method of decoding addresses for a memory operation with a word line coupled to a word line of an integrated circuit device, comprising:
receiving, at a level shifter, a decoder signal; and
providing, from the level shifter, a level shifter output signal having a first voltage range, to a pull-up circuit;
providing, from the pull-up circuit, a voltage switch output signal with a second voltage range widened compared to the first voltage range.

12. The method of claim 11, wherein the level shifter comprises at least one PMOS transistor and at least one NMOS transistor, and the decoder signal from a decoder is input to the at least one PMOS transistor.

13. The method of claim 11, wherein the pull-up circuit comprise a PMOS transistor and a NMOS transistor, and the PMOS transistor receives a trigger signal to output the pull-up circuit voltage output, the trigger signal received from at least one of a decoder and the output of the level shifter.

14. The method of claim 11, wherein:
the level shifter is a negative level shifter, and
the first voltage range of the level shifter is set by a negative first bias voltage and a positive second bias voltage both coupled to the level shifter, and
the second voltage range is set by a positive third bias voltage and the negative first bias voltage both coupled to the pull-up circuit.

15. The method of claim 14, further comprising a select operation in erasing during which the second voltage output is a voltage equal to the positive third bias voltage.

16. The method of claim 14, further comprising a deselect operation in erasing, during which the second voltage output is a voltage equal to the negative first bias voltage.

17. The method of claim 11, further comprising:
receiving, at the pull-up circuit, (i) the decoder signal and (ii) the level shifter output signal, the pull-up circuit providing to a block of NAND memory cells a pull-up circuit output signal.

18. The method of claim 11,
wherein the decoder signal has a third voltage range, and
wherein the second voltage range is wider compared to the third voltage range by including a larger magnitude negative voltage that is absent from the third voltage range, and
wherein the second voltage range is wider compared to the third voltage range by including (i) a larger magnitude negative voltage that is absent from the third voltage range and (ii) a larger magnitude positive voltage that is absent from the third voltage range.

19. The method of claim 11,
wherein the second voltage range is wider compared to the first voltage range by including a larger magnitude positive voltage that is absent from the first voltage range.

20. An apparatus decoding addresses for a memory operation with a word line coupled to a word line of an integrated circuit device, comprising:
level shifter means for receiving a decoder signal and providing a level shifter output signal having a first voltage range; and
pull-up circuit means for providing a voltage switch output signal with a second voltage range widened compared to the first voltage range.

* * * * *